US008753943B2

(12) United States Patent
Pan et al.

(10) Patent No.: US 8,753,943 B2
(45) Date of Patent: Jun. 17, 2014

(54) REPLACEMENT METAL GATE TRANSISTORS WITH REDUCED GATE OXIDE LEAKAGE

(71) Applicant: Advanced Micro Devices, Inc., Sunnyvale, CA (US)

(72) Inventors: James N. Pan, Hopewell Junction, NY (US); John Pellerin, Hopewell Junction, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/873,761

(22) Filed: Apr. 30, 2013

(65) Prior Publication Data

US 2013/0244412 A1    Sep. 19, 2013

Related U.S. Application Data

(63) Continuation of application No. 13/290,275, filed on Nov. 7, 2011, now Pat. No. 8,445,975, which is a continuation of application No. 11/269,745, filed on Nov. 9, 2005, now Pat. No. 8,053,849.

(51) Int. Cl.
    *H01L 21/3205*     (2006.01)

(52) U.S. Cl.
    USPC ............... 438/287; 438/591; 257/E21.621

(58) Field of Classification Search
    USPC .......... 438/287, 591, 763, 786; 257/E21.623, 257/410–411, E21.625, E29.16, E29.128, 257/E21.444, E21.621
See application file for complete search history.

(56) References Cited

U.S. PATENT DOCUMENTS

| | | | |
|---|---|---|---|
| 5,726,080 A | 3/1998 | Losee et al. | |
| 5,783,478 A | 7/1998 | Chau et al. | |
| 6,015,739 A * | 1/2000 | Gardner et al. | 438/287 |
| 6,020,243 A | 2/2000 | Wallace et al. | |
| 6,559,051 B1 * | 5/2003 | Buynoski et al. | 257/E21.444 |
| 6,586,797 B2 | 7/2003 | Forbes et al. | |
| 6,713,358 B1 | 3/2004 | Chau et al. | |
| 6,727,560 B1 | 4/2004 | Pan et al. | |
| 7,030,430 B2 | 4/2006 | Doczy et al. | |
| 7,074,680 B2 | 7/2006 | Doczy et al. | |
| 7,294,547 B1 * | 11/2007 | Orimoto et al. | 438/257 |
| 2005/0037557 A1 | 2/2005 | Doczy et al. | |
| 2005/0181555 A1 | 8/2005 | Haukka et al. | |
| 2005/0224897 A1 | 10/2005 | Chen et al. | |
| 2006/0118890 A1 | 6/2006 | Li | |
| 2006/0237803 A1 | 10/2006 | Zhu et al. | |

OTHER PUBLICATIONS

Gerstner et al., "Nonvolatile Memory Effects in Nitrogen Doped Tetrahedral Amorphous Carbon Thin Films", Journal of Applied Physics, vol. 84, No. 10, Nov. 15, 1998, pp. 5647.
International Search Report and Written Opinion of the International Searching Authority issued in corresponding International Application No. PCT/US2008/042870, dated Aug. 9, 2007.

\* cited by examiner

*Primary Examiner* — Stephen W Smoot
*Assistant Examiner* — Sun M Kim
(74) *Attorney, Agent, or Firm* — Volpe and Koenig, P.C.

(57) ABSTRACT

A method of fabricating a semiconductor device having a transistor with a metal gate electrode and a gate dielectric layer includes forming a protective layer on the gate dielectric layer and forming a metal gate electrode over the protective layer. The protective layer has a graded composition between the gate dielectric layer and the metal gate electrode.

10 Claims, 12 Drawing Sheets

REPLACEMENT METAL GATE TRANSISTORS WITH REDUCED GATE OXIDE LEAKAGE

CROSS REFERENCE TO RELATED APPLICATIONS

This application is a continuation of U.S. patent application Ser. No. 13/290,275, filed Nov. 7, 2011, which is a continuation of U.S. patent application Ser. No. 11/269,745, filed Nov. 9, 2005 now U.S. Pat. No. 8,053,849 issued on Nov. 8, 2011, which are incorporated by reference as if fully set forth.

FIELD OF INVENTION

The present invention relates to semiconductor devices comprising transistors with metal gate electrodes and reduced gate oxide leakage. The present invention is particularly applicable to high speed semiconductor devices having sub-micron design features.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of graded well-doping, epitaxial wafers, halo implants, tip implants, lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Metal gate electrodes have evolved for improving the drive current by reducing polysilicon depletion, and reducing processing temperature subsequent to metal gate formation. In order to implement replacement metal gate process flow, a dummy gate, such as polysilicon, is removed by dry/wet etching, followed by metal deposition.

The relentless drive toward greater miniaturization requires a reduction in the feature size of transistors, including gate oxide layers for metal gate transistors. Such gate oxide layers must be reduced to achieve a very thin effective oxide thickness (EOT). This objective has been illusive in attempting to form gate oxides at thicknesses of about 15 Å because of the leakage current.

Accordingly, there exists a need for metal gate transistors having a gate oxide with a reduced EOT with reduced leakage current. There also exists a need for methodology enabling the fabrication of semiconductor devices comprising metal gate transistors having a gate oxide with a reduced EOT without sacrificing device speed.

SUMMARY

An advantage of the present invention is a semiconductor device having a transistor with a metal gate electrode and a gate oxide having a reduced EOT and reduced leakage current.

Another advantage of the present invention is a method of fabricating a semiconductor device comprising a transistor with a metal gate electrode and a gate oxide having a reduced EOT and reduced leakage current.

Addition advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising: a substrate; a gate dielectric layer on the substrate; a protective layer on the gate dielectric layer; and a metal gate electrode on the protective layer; wherein, the protective layer has a graded composition between the gate dielectric layer and the metal gate electrode.

Embodiments of the present invention comprise metal gate transistors with a gate oxide, e.g., silicon oxide, and a protective layer thereon. Aspects of this embodiment include a protective layer comprising an amorphous carbon layer containing metal carbides, formed by diffusing metal from the gate electrode into the amorphous carbon layer, at a concentration up to about 50 at. %. Typically, the concentration of the metal carbides is about 80 at. % approximate the interface between the amorphous carbon layer and the metal gate electrode and decreases across the amorphous carbon layer to about 20 at. % at the interface with the gate oxide layer. Embodiments also include depositing an amorphous carbon layer containing at least one additional element, such as oxygen, silicon and/or nitrogen.

Another aspect of the present invention is a semiconductor device comprising: a substrate; a gate dielectric layer on the substrate; and a metal gate electrode on the gate dielectric layer; wherein, the gate dielectric layer comprises an oxide layer containing an oxide having a dielectric constant (k) greater than 4, and silicon concentrated at interfaces of the oxide layer with the substrate and with the metal gate electrode.

Embodiments include forming a gate dielectric layer comprising a layer of polycrystalline silicon on the substrate, the oxide layer containing the high dielectric constant oxide on the first polycrystalline silicon layer, and a second layer of polycrystalline silicon on the oxide layer and adjacent the metal gate electrode.

Another aspect of the present invention is a method of fabricating a semiconductor device having a transistor with a metal gate electrode, the method comprising: forming a removable gate over a substrate with a gate dielectric layer therebetween; forming a dielectric layer over the substrate and exposing an upper surface of the removable gate; removing the removable gate leaving an opening in the dielectric layer defined at its bottom by the gate dielectric layer and defined at its sides by exposed surfaces of the dielectric layer; forming a protective layer on the gate dielectric layer and lining the opening; and forming a metal gate electrode in the opening; wherein, the protective layer has a graded composition between the gate dielectric layer and the metal gate electrode.

Embodiments include depositing a layer of amorphous carbon by chemical vapor deposition (CVD) or atomic layer deposition (ALD), and heating to an elevated temperature to diffuse metal; e.g., cobalt, (Co), nickel (Ni), tantalum (Ta) or molybdenum (Mo), into the amorphous carbon layer to form the metal carbides decreasing in concentration from the metal gate electrode across the amorphous carbon layer to the gate dielectric layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modification in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 12, similar features are denoted by similar reference characters.

DETAILED DESCRIPTION OF THE PREFERRED EMBODIMENTS

Figure 1:
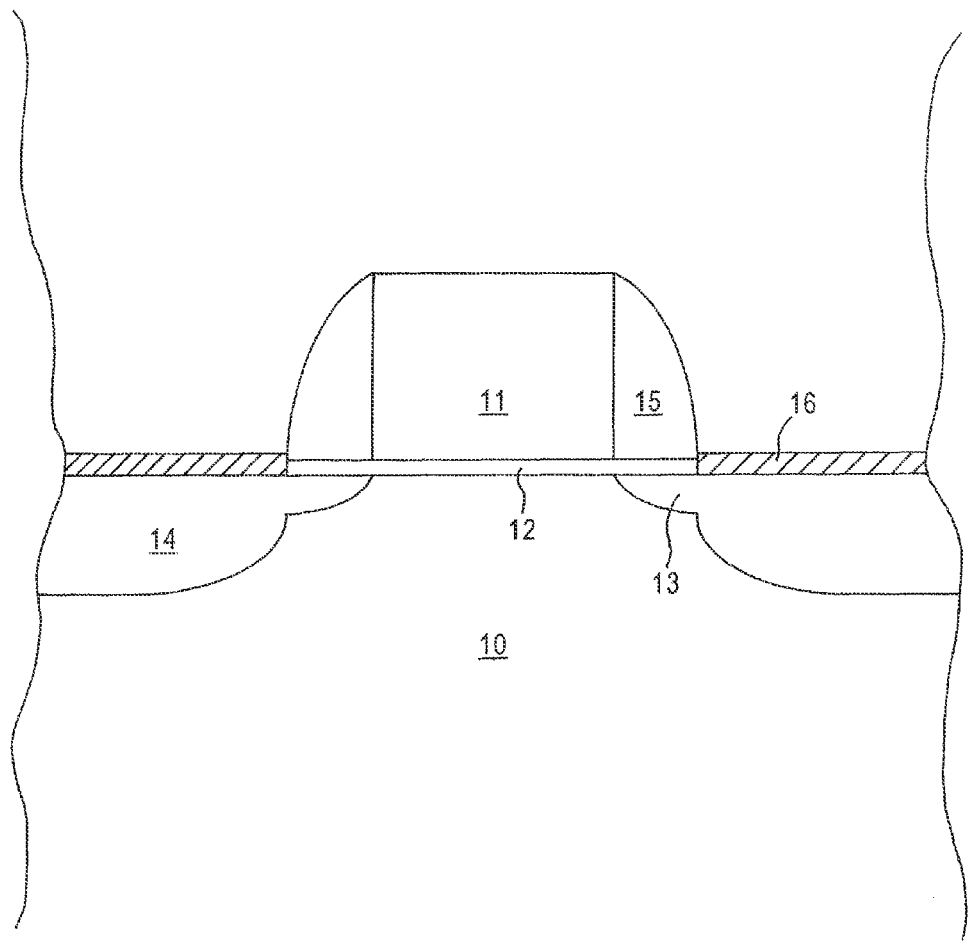
FIGS. 1 through 7 schematically illustrate sequential phases of a method in accordance with an embodiment of the present invention.

The present invention addresses and solves problems attendant upon conventional practices relating to the formation of polysilicon gate electrodes, which problems stem from their high resistivity and, hence, slower operating speed. The present invention also addresses and solves problems attendant upon attempting to reduce the gate oxide thickness of replacement metal gate transistors, such as increased leakage current and reduced operating speed.

The present invention addresses and solves such problems by providing metal gate transistors with gate oxides having a reduced EOT without an increase in leakage, e.g., gate oxides having a thickness of less than 15 Å, such as a thickness of 5 Å to 12 Å, e.g., 10 Å, by techniques which include forming a protective layer on the gate oxide layer, which protective layer has a graded composition between the gate oxide layer and the gate electrode layer. The formation of a graded protective layer reduces stress between the gate electrode and the gate oxide layer, thereby reducing defects and, hence, reduces leakage current.

In accordance with embodiments of the present invention, after removing a removable or "dummy" gate, such as a polycrystalline silicon gate, a layer of amorphous carbon is deposited on the exposed gate oxide and lining the opening created by removing the "dummy" gate. A metal layer, such as Ta, Ni, Co, Mo, is then deposed followed by chemical-mechanical polishing (CMP) to form the replacement metal gate. Subsequently, heating is conducted to diffuse metal from the metal gate electrode into the amorphous carbon layer to form metal carbides.

Embodiments of the present invention include heating to a temperature of about 300° C. to 600° C., e.g., 400° C., for about 30 seconds to about 5 minutes, under vacuum or in an appropriate atmosphere, such as argon, nitrogen, or a forming gas comprising about 4 vol. % hydrogen and about 96 vol. % nitrogen. During heating, metal from the gate electrode diffuses into the amorphous carbon layer and forms carbides, as in an amount up to about 50 at. %. The resulting structure of the protective layer is a graded composition containing a higher amount of metal carbides at the interface of the amorphous carbon layer with the gate electrode, decreasing across the amorphous carbon layer to the gate oxide layer. Embodiments of the present invention include heating to diffuse metal from the metal gate electrode into the amorphous carbon layer to form a graded composition comprising about 80 at. % metal carbide proximate the interface with the replacement metal gate electrode gradually decreasing across the amorphous carbon layer to a concentration of about 20 at. % proximate the interface with the gate oxide layer. Advantageously, the graded composition enhances compatibility between the gate oxide layer and metal gate electrode, thereby reducing stress and, hence, reducing defects resulting in a reduced leakage current and increased operating speed.

In another embodiment of the present invention, the gate oxide layer is formed of a high dielectric constant material, e.g., a dielectric material having a dielectric constant (k) greater than or equal to 4, with 1 based upon a vacuum. Embodiments of the present invention include forming a gate dielectric layer from a dielectric material having a dielectric constant (k) of 4 to less than about 500, such as about 4 to less than about 40. Embodiments of the present invention also include forming the gate dielectric material from a high dielectric constant (k) material having a dielectric constant (k) of about 4 to about 30, e.g., about 4 to about 20. Suitable dielectric materials include $Ta_2O_5$, $Hf_2O_3$ and $HfSiS_3$. In such embodiments it has been found advantageous to form the gate oxide layer with a high concentration of silicon at an interface between the gate oxide layer and the substrate and at the interface between the gate oxide layer and the replacement metal gate electrode. Other embodiments include forming a layer of polycrystalline silicon at the interface between the high dielectric constant gate oxide layer and substrate and a layer of polycrystalline silicon at the interface between the high dielectric constant gate oxide layer and the replacement metal gate electrode.

An embodiment of the present invention is schematically illustrated in FIGS. 1 through 7. Adverting to FIG. 1, a temporary replaceable or dummy gate 11, such as polysilicon, is formed over substrate 10 with a gate dielectric layer 12 therebetween, such as silicon oxide. Embodiments of the present invention also include depositing a high dielectric constant material for the gate dielectric layer 12, such as $ZrO_2$, $HfO_2$, $Hf_2O_3$, $HfSiO_3$, $InO_2$, $LaO_2$, $Ta_2O_3$ and $TaO_2$. Shallow source/drain extensions 13 are then formed. Subsequently, dielectric sidewall spacers 15, such as silicon oxide, silicon nitride or silicon oxynitride, are formed on removable gate 11. Ion implantation is then conducted to form deep source/drain regions 14, followed by silicidation to form metal silicide layer 16 on the exposed surfaces of the source/drain regions 13, such as nickel silicide by depositing a layer of Ni and then heating. Manipulative steps illustrated in FIG. 1 are implemented in a conventional manner.

Figure 2:
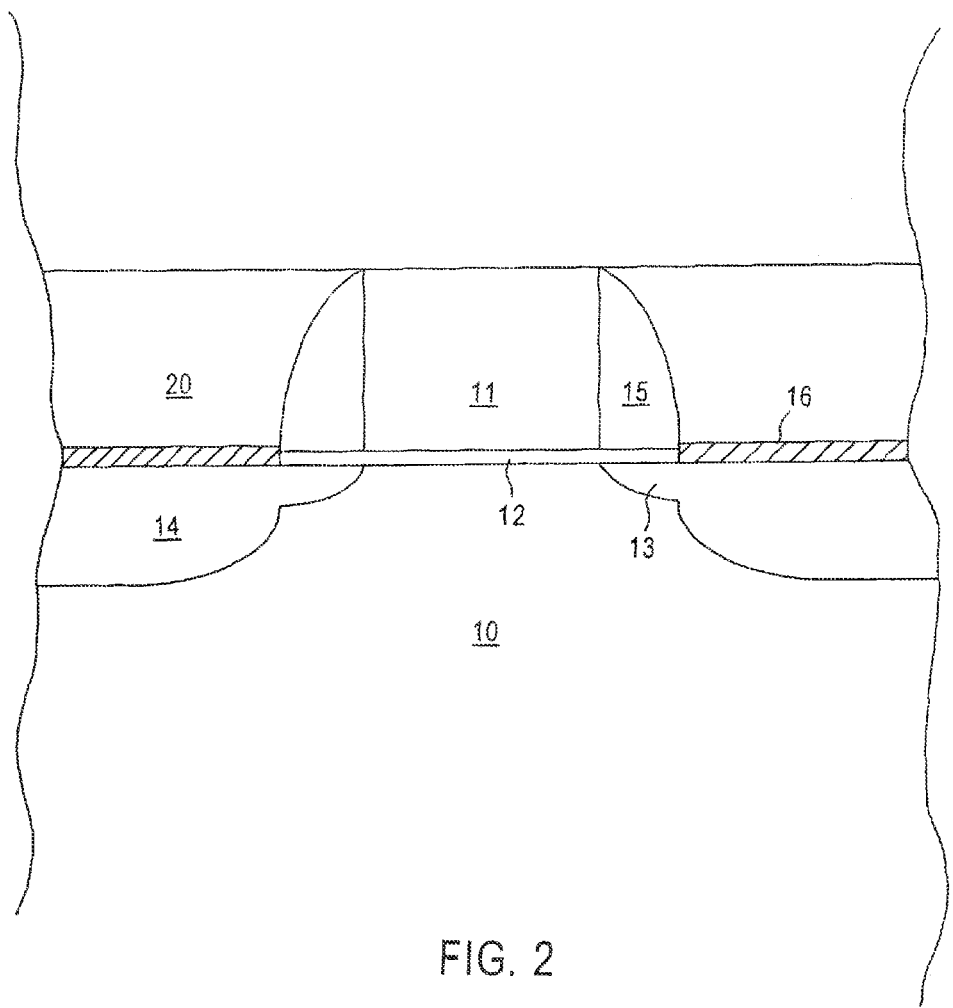

Adverting to FIG. 2, a layer of dielectric material, such as silicon oxide, e.g., silicon oxide formed from tetraethyl orthosilicate (TEOS), is deposited followed by chemical mechanical polishing (CMP) forming dielectric layer 20. It should be understood that shallow source/drain extensions 13 and source/drain regions 14 are activated by high temperature thermal annealing, such as at a temperature of about 900° C. and above, at the stage illustrated in FIG. 1 or alternatively, FIG. 2 or alternatively, even at the stage illustrated in FIG. 3 prior to depositing the replacement metal gate electrode.

Figure 3:
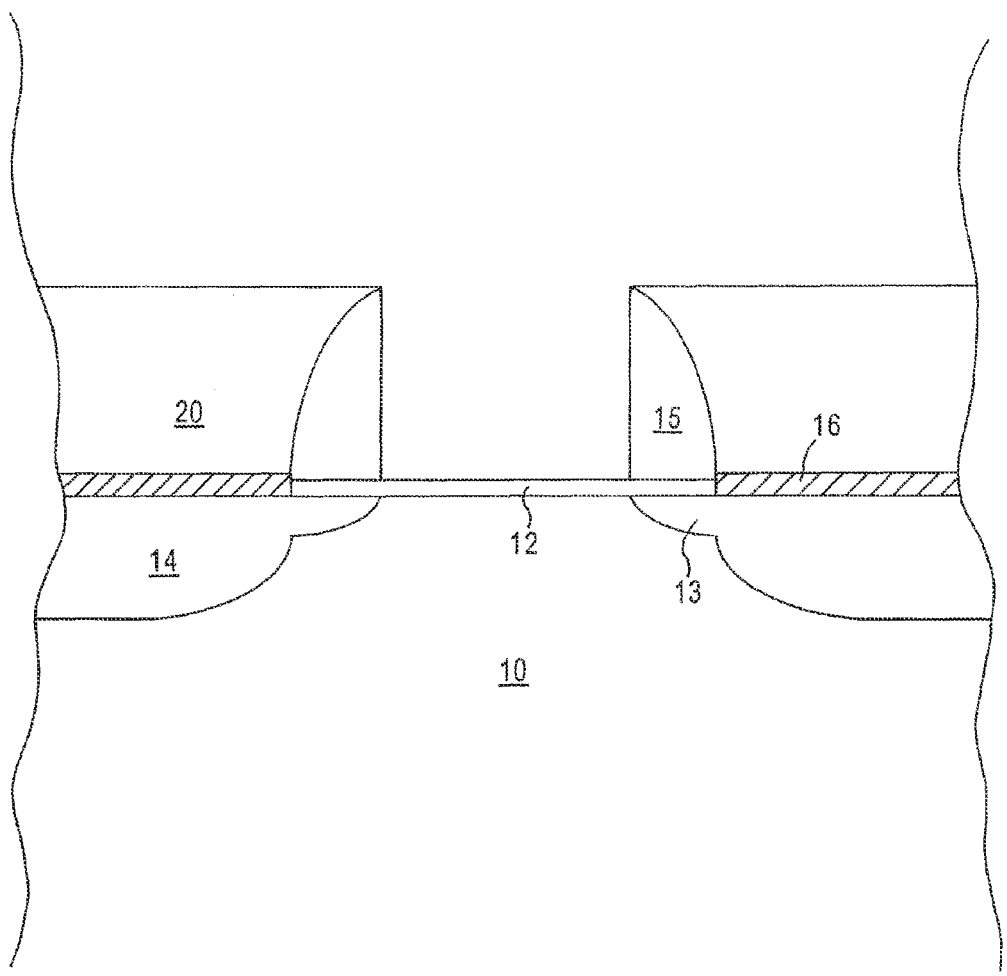
Figure 4:
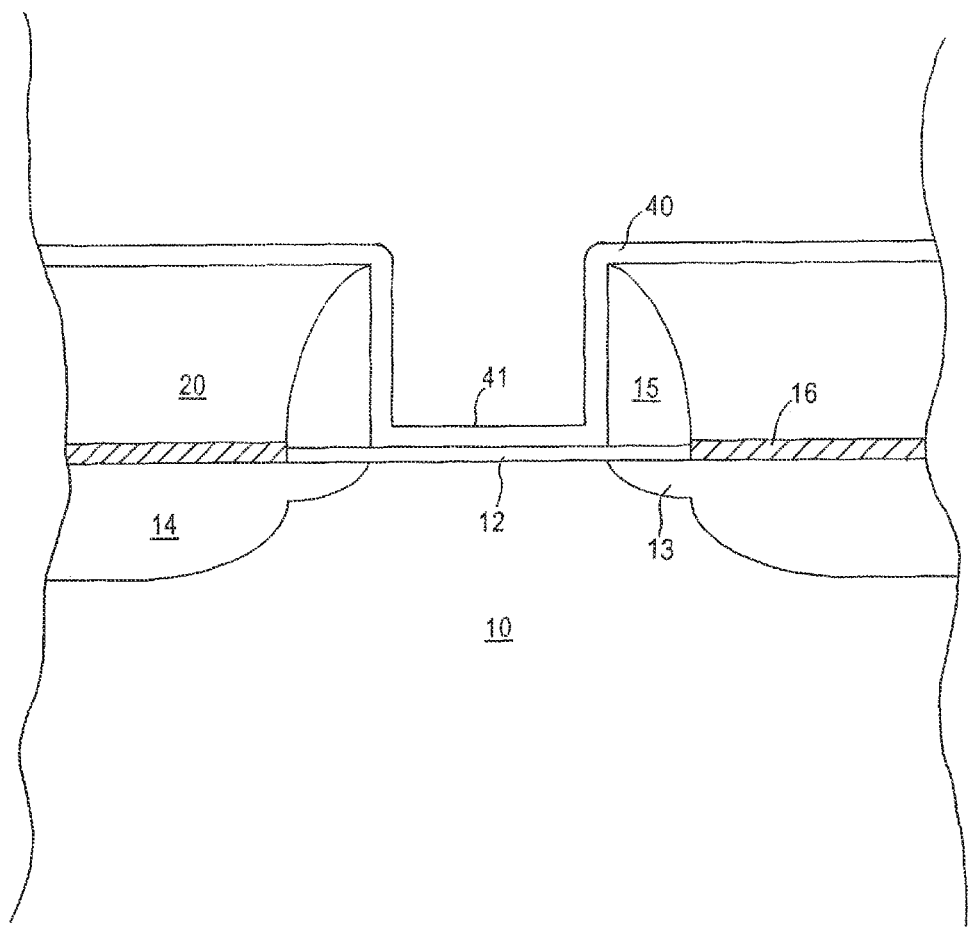

As illustrated in FIG. 3, replacement or dummy gate 11 is removed, as by etching, e.g., using a solution of hydrofluoric acid and nitric acid in acetic acid. In accordance with aspects of this embodiment, a layer of amorphous carbon 40 is deposited lining the opening created by removing the dummy polysilicon gate 11, as schematically illustrated in FIG. 4. Embodiments of the present invention include depositing amorphous carbon layer 40 by CVD or ALD. Typically, the layer of amorphous carbon is deposited at a thickness up to about 50 Å, such as about 10 to about 50 Å, e.g., about 25 to 35 Å. Suitable results may be obtained by depositing amorphous carbon layer at about a thickness about 30 Å.

Figure 5:
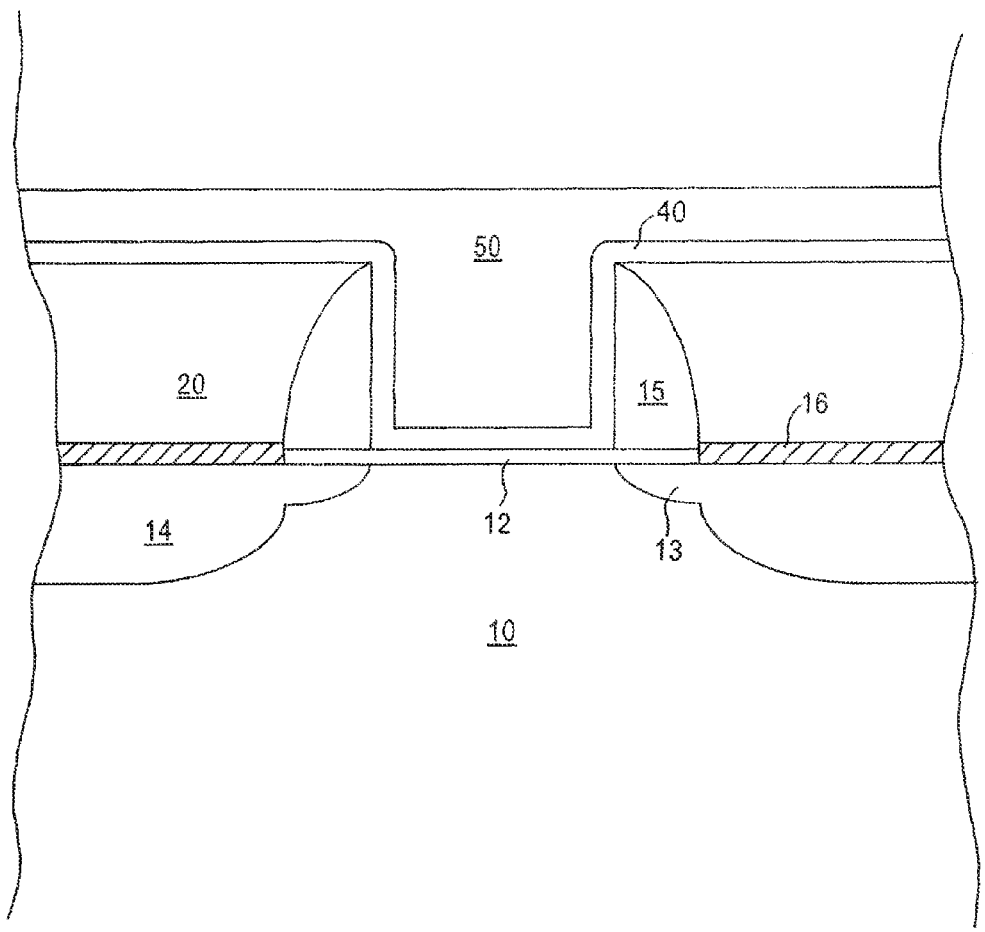
Figure 6:
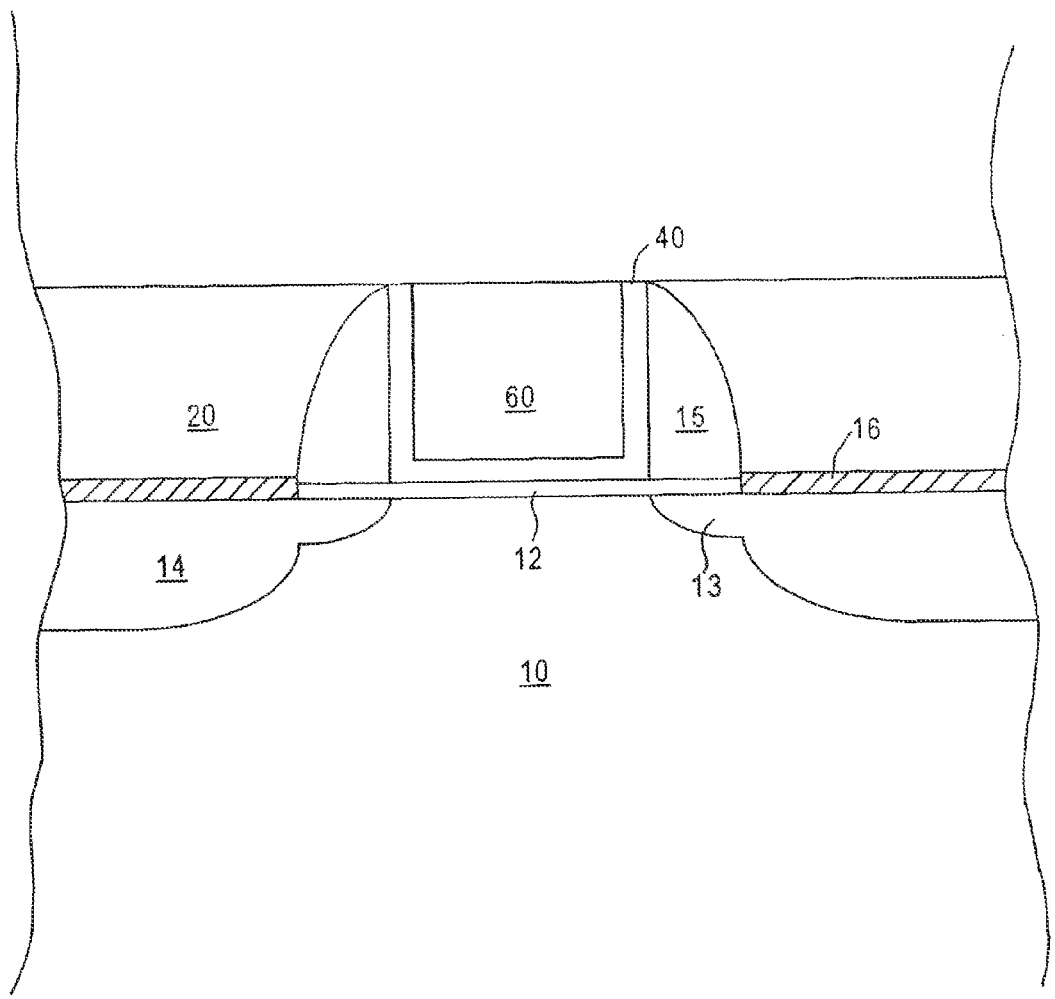

Subsequently, as illustrated in FIG. 5, a layer of conductive material 50, such as tantalum, nickel, cobalt and molybdenum is deposited, as by a physical vapor deposition technique. Embodiments of the present invention comprise depositing an initial layer of metal, such as tantalum, nickel, cobalt or molybdenum, and then depositing a layer of copper (Cu) or a Cu alloy. CMP is then implemented to planarize the upper surface of the deposited conductive material, thereby completing the metal gate 60 as illustrated in FIG. 6.

In another embodiment of the present invention, the amorphous carbon layer is deposited by CVD and contains at least one element, such as oxygen, silicon and nitrogen. Embodiments include deposition by CVD using oxygen, silane ($SiH_4$) and nitrogen. The inclusion of oxygen, silicon and/or nitrogen in the initial amorphous carbon layer further reduces stress and defects resulting from stress, thereby reducing leakage current.

Figure 7:
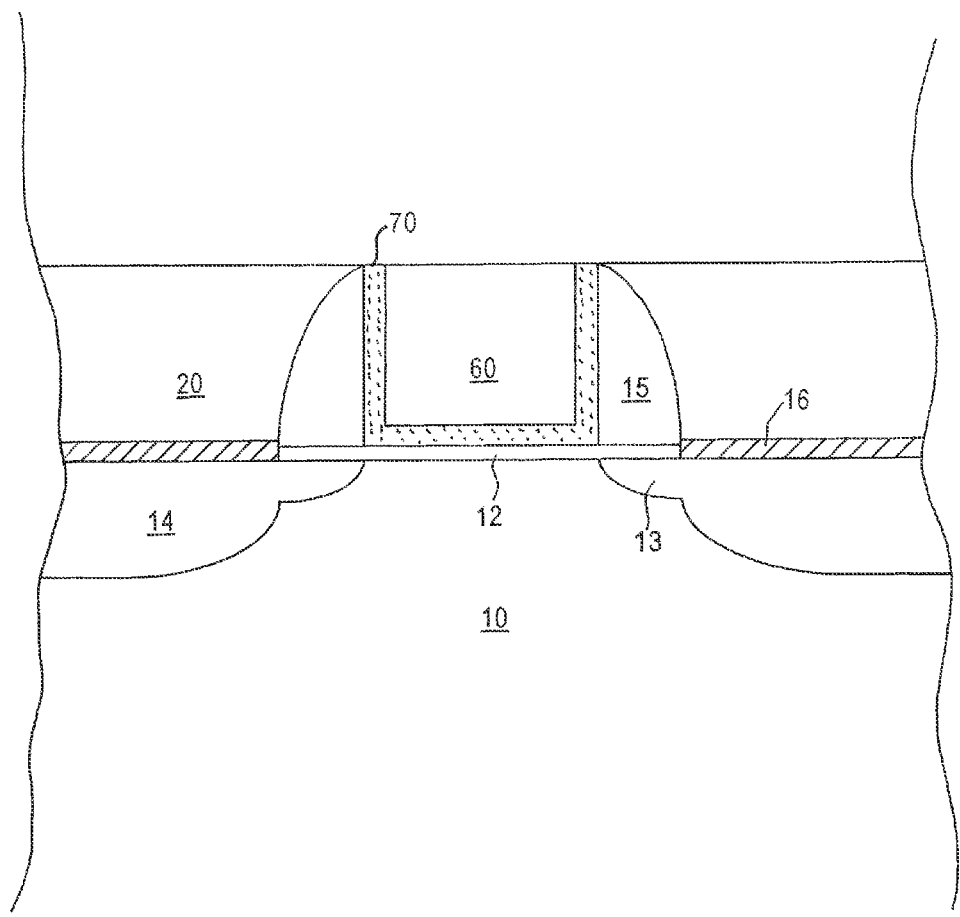
Figure 8:
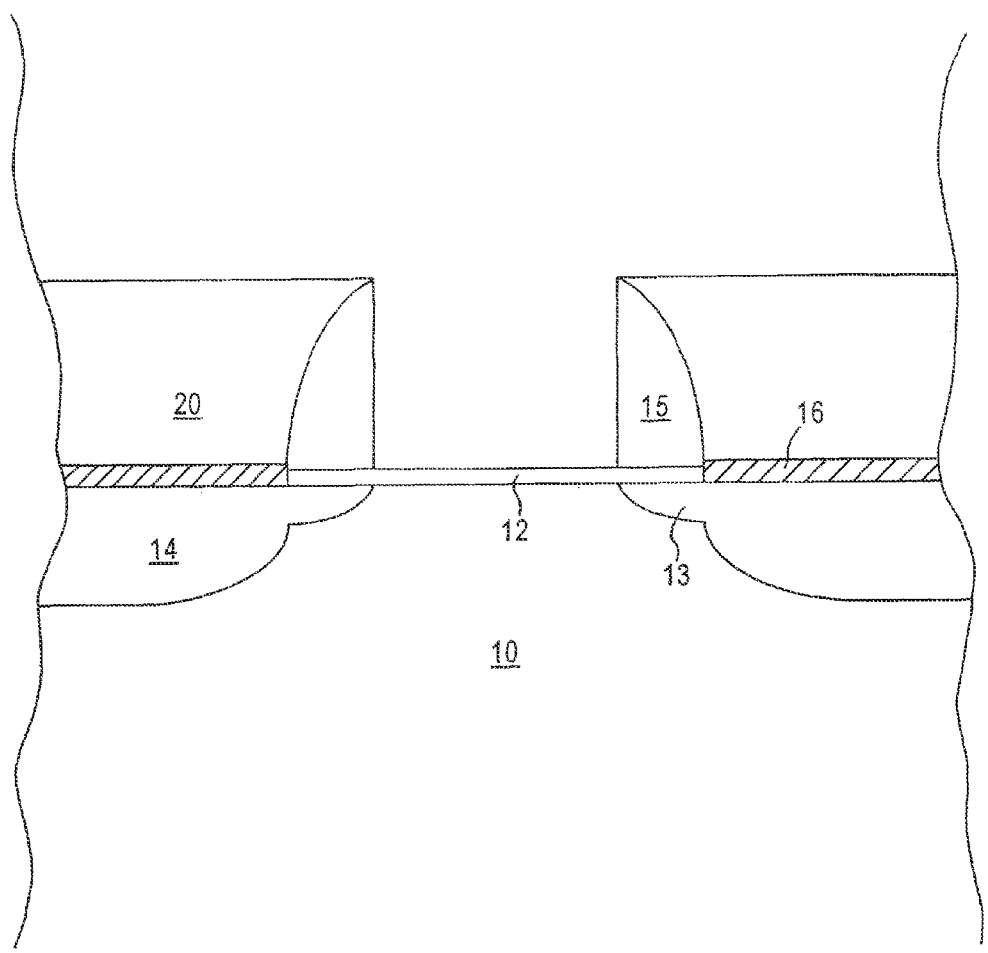
FIGS. 8 through 12 represent sequential phases of another embodiment of the present invention.
Figure 9:
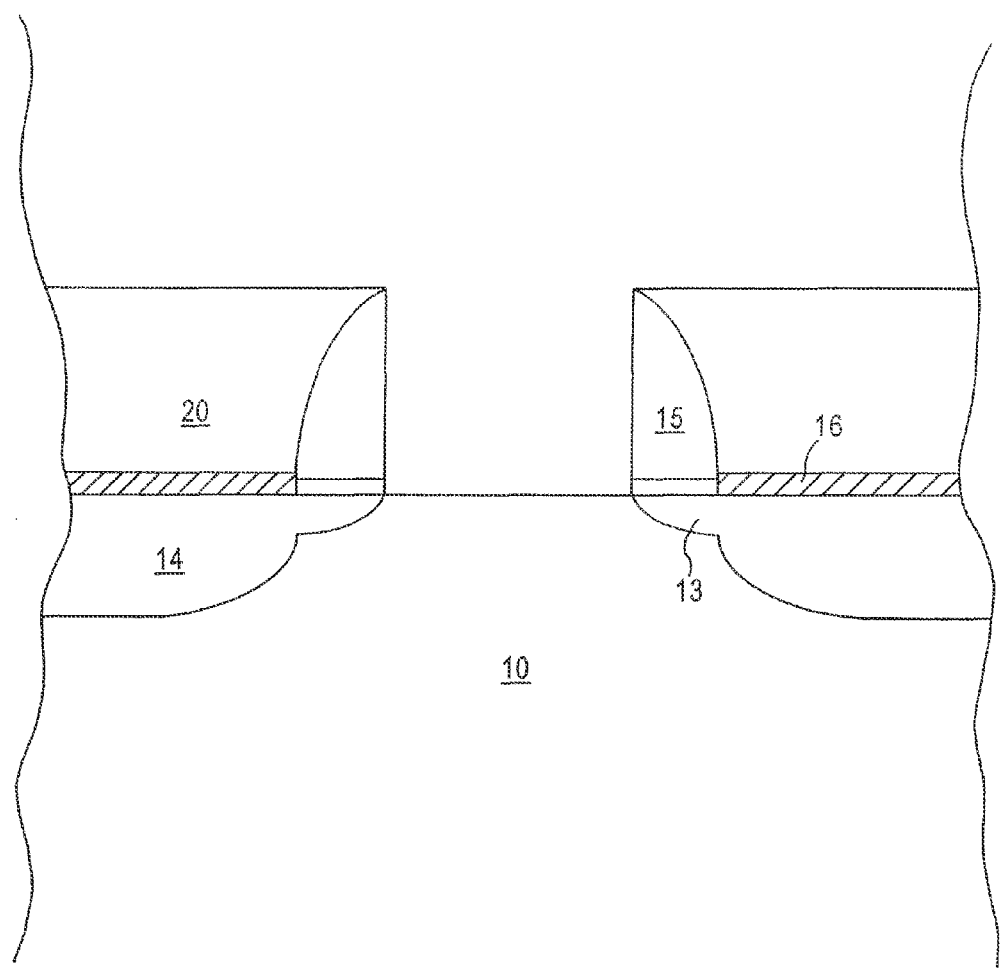
Figure 10:
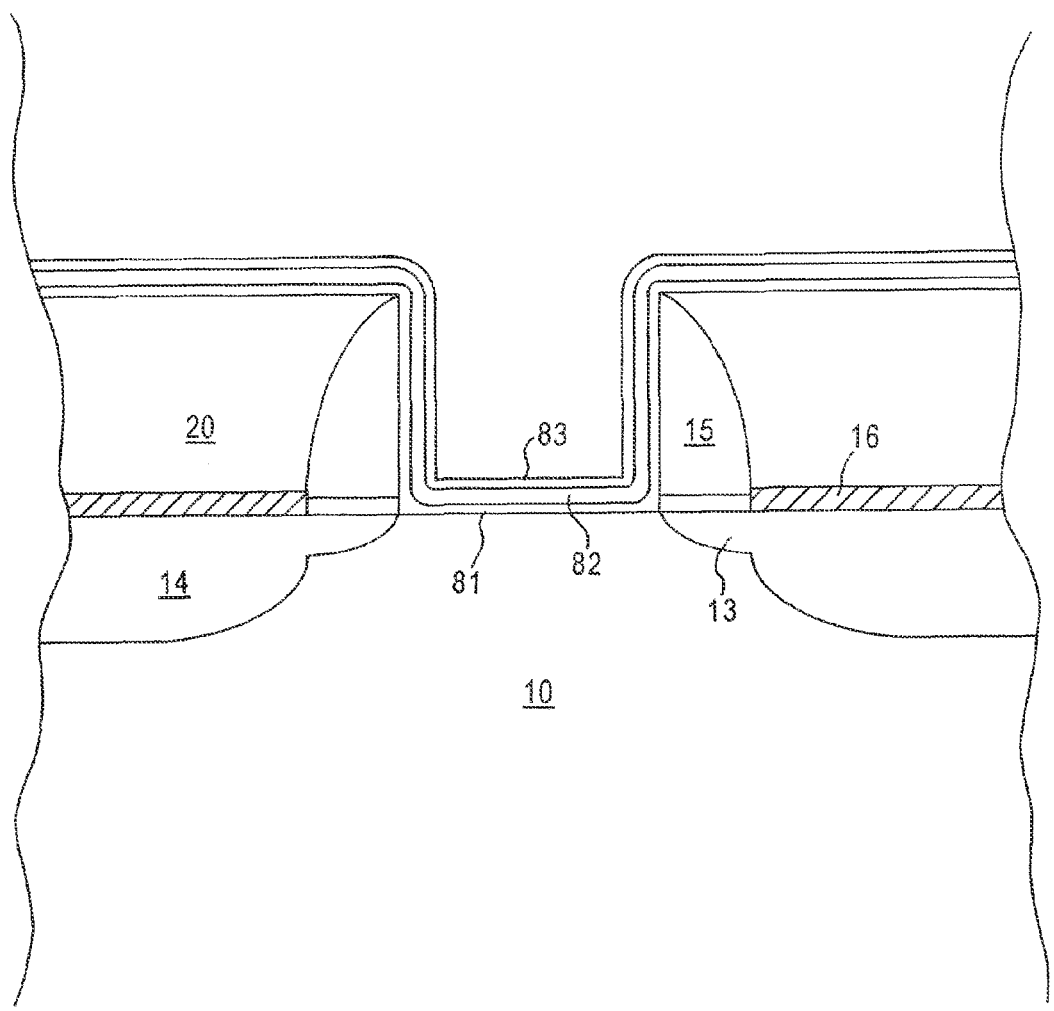

Subsequently, heating is typically implemented at a temperature of about 300° C. to about 600° C., e.g., 400° C., for about 30 seconds to about 5 minutes, under vacuum or is an appropriate atmosphere such as, argon, nitrogen or a forming gas comprising about 4 vol. % hydrogen and about 96 vol. % nitrogen. During heating metal from the replacement metal gate diffuses into the amorphous carbon layer 40 forming carbides in a concentration gradually decreasing from the interface between amorphous current layer 40 and metal gate 60 across amorphous carbon layer 40 toward gate dielectric layer 12. The resulting structure is shown in FIG. 7 with element 70 representing the protective layer of amorphous carbon having metal carbides therein.

Typically heating is conducted under conditions sufficient to form up to 50 at. % metal carbides. The metal carbide concentration typically ranges from about 80 at. % proximate the interface between protective layer 70 and metal gate electrode 60 gradually decreasing across the thickness of protective layer 70 to about 20 at. % proximate the interface between protective layer 70 and gate oxide layer 12. Protective layer 70 having a graded composition improves compatibility thereby decreasing stress and, hence, decreasing defects generated at the gate electrode/gate oxide interface. In this way, the EOT can be significantly reduced without an attendant disadvantageous increase in leakage current.

Another embodiment of the present invention is schematically illustrated in FIGS. 8 through 12. Adverting to FIG. 8, processing is implemented as in FIGS. 1 through 3, FIG. 8 essentially corresponding to FIG. 3. At this point the gate oxide layer is removed as by employing a conventional hydrofluoric acid etch, resulting in the intermediate structure illustrated in FIG. 9. In this embodiment, a new gate oxide is formed which does not contain radiation damage due to plasma treatments to remove the polysilicon dummy gate or deposition of the placement metal gate. In accordance with aspects of this embodiment, a new gate dielectric is formed comprising a high dielectric constant material with silicon concentrated at the interface with the substrate and at the interface with the metal gate electrode, thereby forming a graded gate dielectric layer compatible with both the substrate and the metal gate and, hence, reducing stress and associated defects.

Figure 11:
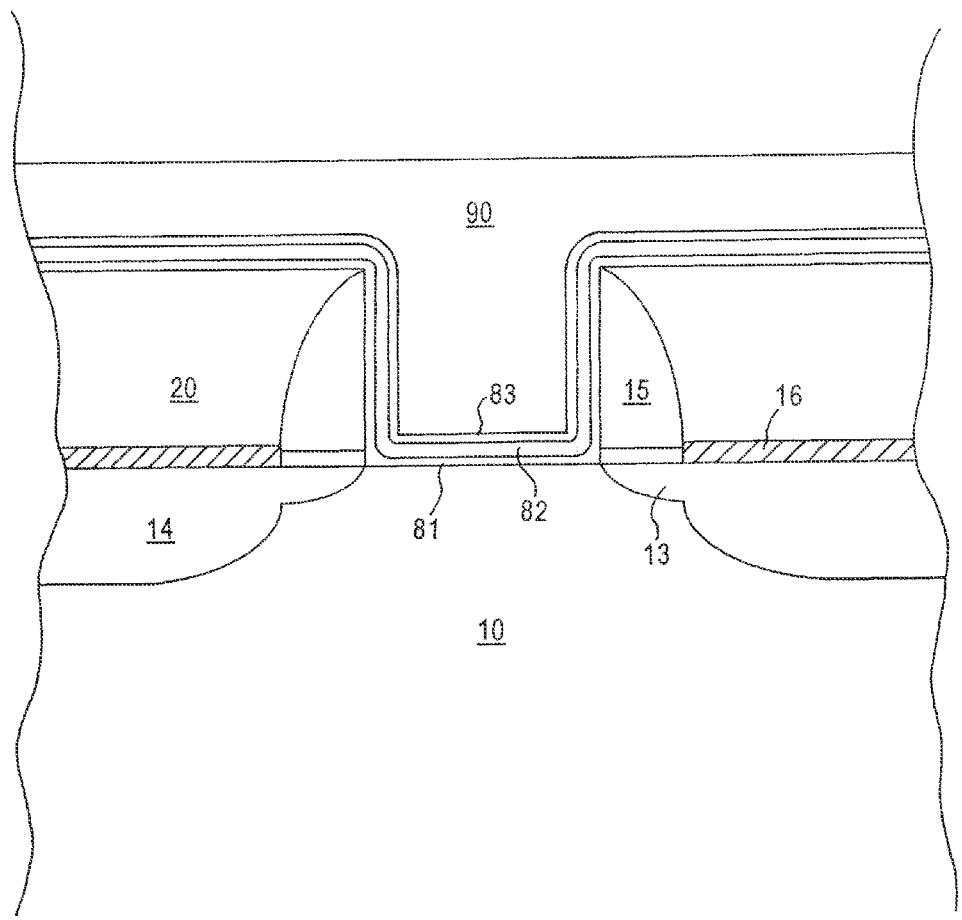
Figure 12:
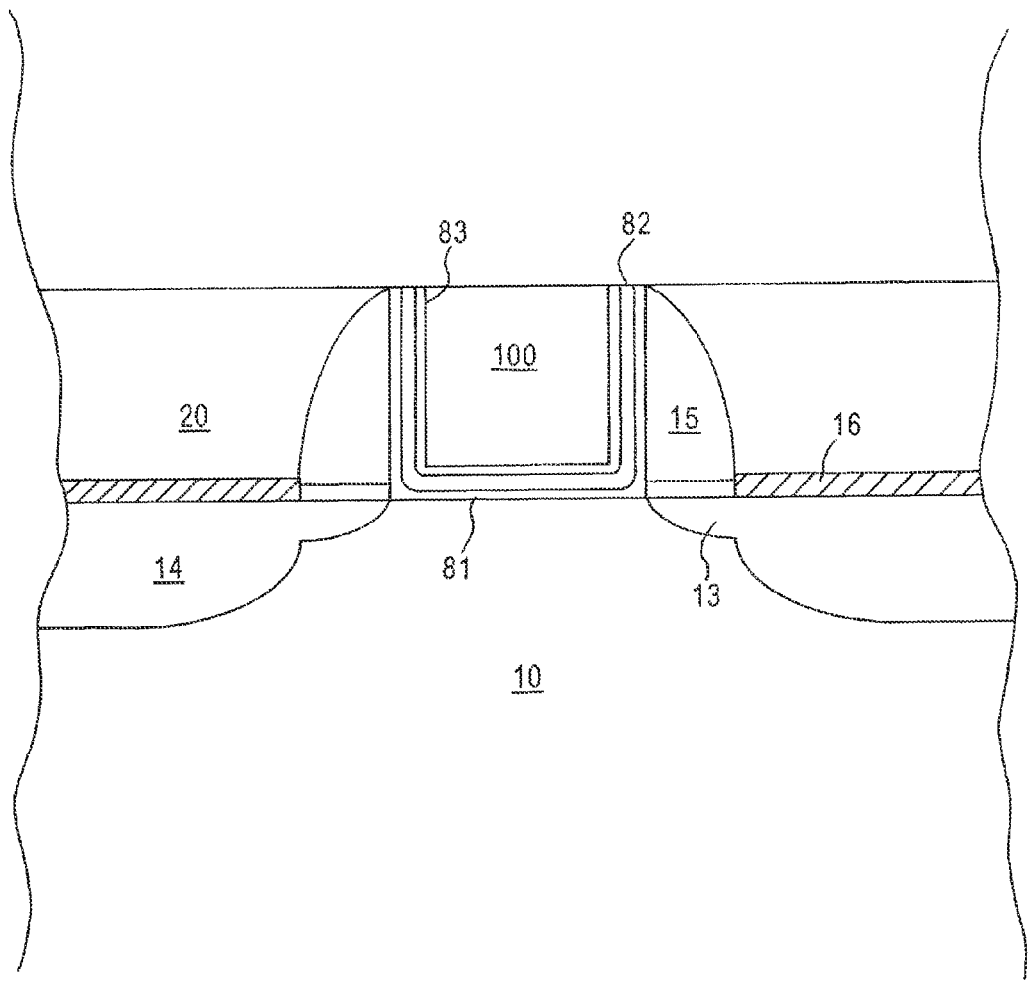

After removing the original gate oxide 12, the graded high dielectric constant gate oxide is formed. Aspects of this embodiment include depositing an initial layer of polycrystalline silicon 81, shown in FIG. 10, depositing a high dielectric constant material 82 thereon, such as $Ta_2O_5$, $Hf_2O_3$, or $HfSiO_3$, and then depositing another layer of polycrystalline silicon 83 on the high dielectric constant material 82. As shown in FIG. 11, a metal 90 is then deposited. Aspects of this embodiment include depositing an initial Ta layer followed by a layer of Cu or Cu alloy.

CMP is then implemented resulting in the structure schematically illustrated in 12 comprising metal gate electrode 100. The graded composite gate dielectric layer comprising silicon concentrated at the interface with substrate 10 and at the interface with metal gate electrode 100 significantly reduces stress and, hence, reduces defects, thereby enabling a reduced EOT without increased leakage current.

Embodiments of the present invention include the use of various types of amorphous carbon, such as carbon containing hydrogen, e.g., amorphous hydrogenated carbon having a hydrogen concentration of about 5 at. % to about 40 at. %, typically about 20 at. % to about 30 at. %. Embodiments of the present invention also include amorphous carbon nitride, sometimes referred to as nitrogenated carbon, generally having a nitrogen to hydrogen concentration ratio of about 5:20 to 30:0. Amorphous hydrogen-nitrogenated carbon may also be employed.

The present invention provides methodology enabling the fabrication of semiconductor devices having transistors with metal gate electrodes and gate oxides with ultra thin EOT while preventing the generation of leakage current. The present invention enables adjustment of $V_c$ across the graded profile of the protective layer on the gate oxide layer.

The present invention enjoys industrial applicability in the fabrication of various types of semiconductor devices. The present invention is particularly applicable in fabricating semiconductor devices having submicron features and exhibiting a high drive current and minimized leakage current.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present application. It is to be understood that the present invention is capable of use in various other combinations and environments, and is capable of changes or modifications within the scope of the inventive concept as expressed herein.

What is claimed is:

1. A method of fabricating a semiconductor device having a transistor with a metal gate electrode, the method comprising:
   forming a removable gate over a substrate with a gate dielectric layer therebetween;
   forming a dielectric layer over the substrate and exposing an upper surface of the removable gate;
   removing the removable gate leaving an opening in the dielectric layer defined at its bottom by the gate dielectric layer and defined at its sides by exposed surfaces of the dielectric layer;

forming a protective layer on the gate dielectric layer and lining the opening, wherein the forming of the protective layer comprises:
  depositing a layer of amorphous carbon by chemical vapor deposition or atomic layer deposition; and
  heating to diffuse metal from the metal gate electrode into the layer of amorphous carbon to form up to 50 at. % metal carbides decreasing in concentration from the metal gate electrode across the amorphous carbon layer to the gate dielectric layer; and
forming a metal gate electrode in the opening; wherein,
the protective layer has a graded composition between the gate dielectric layer and the metal gate electrode.

2. The method of claim 1, wherein the gate dielectric layer comprises an oxide.

3. The method according to claim 1, wherein the metal gate electrode comprises a metal selected from the group consisting of cobalt, nickel, tantalum and molybdenum.

4. The method according to claim 1, comprising heating to form the metal carbides having a concentration which decreases from about 80 at. % at an interface with the metal gate electrode across the amorphous carbon layer to about 20 at. % at the interface with the gate oxide layer.

5. The method according to claim 1, wherein the amorphous carbon layer includes at least one of the elements silicon, oxygen or nitrogen.

6. The method according to claim 1, comprising forming the protective layer at a thickness of about 10 Å to about 50 Å.

7. The method according to claim 1, comprising forming the protective layer at a thickness of about 25 Å to about 35 Å.

8. A method of fabricating a semiconductor device having a transistor with a metal gate electrode and a gate dielectric layer, the method comprising:
  forming a protective layer on the gate dielectric layer; and
  forming a metal gate electrode over the protective layer;
  wherein the protective layer has a graded composition between the gate dielectric layer and the metal gate electrode, the forming of the protective layer comprising:
    depositing a layer of amorphous carbon on the gate dielectric layer; and
    heating to diffuse metal from the metal gate electrode into the layer of amorphous carbon to form metal carbides decreasing in concentration from the metal gate electrode across the amorphous carbon layer to the gate dielectric layer.

9. The method of claim 8, wherein the depositing a layer of amorphous carbon is done by chemical vapor deposition or atomic layer deposition.

10. The method according to claim 8, wherein the heating forms a carbide concentration of up to 50% at the metal gate electrode.

* * * * *